(12) United States Patent
Nourbakhsh et al.

(10) Patent No.: US 9,184,270 B2
(45) Date of Patent: Nov. 10, 2015

(54) GRAPHENE BASED FIELD EFFECT TRANSISTOR

(71) Applicants: IMEC, Leuven (BE); Katholieke Universiteit Leuven, K.U.LEUVEN R&D, Leuven (BE)

(72) Inventors: Amirhasan Nourbakhsh, Heverlee (BE); Marc Heyns, Linden (BE); Stefan De Gendt, Wijnegem (BE)

(73) Assignees: IMEC, Leuven (BE); Katholieke Universiteit Leuven, K.U.LEUVEN R&D, Leuven (BE)

(*) Notice: Subject to any disclaimer, the term of this patent is extended or adjusted under 35 U.S.C. 154(b) by 0 days.

(21) Appl. No.: 14/231,315

(22) Filed: Mar. 31, 2014

(65) Prior Publication Data

US 2014/0299841 A1 Oct. 9, 2014

(30) Foreign Application Priority Data

Apr. 9, 2013 (EP) .................................. 13162837

(51) Int. Cl.
| | |
|---|---|
| *H01L 21/24* | (2006.01) |
| *H01L 29/775* | (2006.01) |
| *H01L 21/02* | (2006.01) |
| *H01L 29/16* | (2006.01) |
| *H01L 29/51* | (2006.01) |
| *H01L 29/778* | (2006.01) |
| *H01L 29/66* | (2006.01) |

(52) U.S. Cl.
CPC .......... *H01L 29/775* (2013.01); *H01L 21/0262* (2013.01); *H01L 21/02527* (2013.01); *H01L 29/1606* (2013.01); *H01L 29/513* (2013.01); *H01L 29/778* (2013.01); *H01L 29/66015* (2013.01); *H01L 2924/13088* (2013.01)

(58) Field of Classification Search
CPC combination set(s) only.
See application file for complete search history.

(56) References Cited

U.S. PATENT DOCUMENTS

| | | | |
|---|---|---|---|
| 2010/0181655 A1 | 7/2010 | Colombo et al. | |
| 2011/0163289 A1 | 7/2011 | Zhu | |
| 2012/0168721 A1 | 7/2012 | Kelber et al. | |
| 2012/0276718 A1 | 11/2012 | Cheng et al. | |
| 2012/0325296 A1 | 12/2012 | Woo et al. | |
| 2013/0248824 A1* | 9/2013 | Kelber | .................. H01L 29/778 257/29 |
| 2014/0021446 A1* | 1/2014 | Lee | ...................... H01L 29/4908 257/29 |
| 2014/0131662 A1* | 5/2014 | Kelber | .............. H01L 21/02381 257/29 |
| 2014/0299841 A1* | 10/2014 | Nourbakhsh | ......... H01L 29/775 257/29 |

OTHER PUBLICATIONS

Loh et al (Journal of Materials Chemistry, 20, No. 12 (2010):2277-2289).*
Yu et al (Nano letters, Nov. 9, 2011; 11(11):4759-4763).*

(Continued)

*Primary Examiner* — Matthew W Such
*Assistant Examiner* — Ali Naraghi
(74) *Attorney, Agent, or Firm* — Knobbe Martens Olson & Bear, LLP

(57) ABSTRACT

A semiconductor device comprising a graphene layer, a graphene oxide layer overlaying the graphene layer, and a high-k dielectric layer overlaying the graphene oxide layer is provided, as well as a method for producing the same. The method results in a graphene chemical functionalization that efficiently and uniformly seeds ALD growth, preserves the underlying graphene structure, and achieves desirable dielectric properties such as low leakage current and high capacitance.

9 Claims, 5 Drawing Sheets

(56) References Cited

OTHER PUBLICATIONS

Jung et al (Nano Letters, Dec. 2008; 8(12): 4283-4287).*
Jin et al (J.Phys. D: Appl.Phys.42(2009); ISN: 0022-3727).*
Alaboson et al. "Seeding Atomic Layer Deposition of High-k Dielectrics on Epitaxial Graphene with Organic Self-Assembled Monolayers", ACSNANO, vol. 5, No. 6, 5223-5232 (2011).
Alles et al. "Atomic layer deposition of $HfO_2$ on graphene from $HfCl_4$ and $H_2O$", arXiv:1005.1469 [cond-mat.mtrl-sci] (Submitted on May 10, 2010).
Alles et al. "Atomic Layer Deposition of High-k Oxides on Graphene", Chapter 7, pp. 99-114, Graphene—Synthesis, Characterization, Properties and Applications, edited by Jian Ru Gong, ISBN 978-953-307-292-0, 184 pages, Publisher: InTech, Chapters published Sep. 15, 2011 under CC BY-NC-SA 3.0 license DOI: 10.5772/1742.
Fallahazad et al. "Dielectric thickness dependence of carrier mobility in graphene with $HfO_2$ top dielectric", Appl. Phys. Lett. 97, 123105 (2010); doi: 10.1063/1.3492843.
Farmer et al. "Utilization of a buffered dielectric to achieve high field-effect carrier obility in graphene transistors", *Nano Lett.*, vol. 9, No. 12, 2009, pp. 4474-4479.
Garces et al. "Graphene functionalization and seeding for dielectric deposition and device integration", J. Vac. Sci. Technol. B 30, 030801 (2012); doi: 10.1116/1.3693416.
Lee et al. "Characteristics of high-k $Al_2O_3$ dielectric using ozone-based atomic layer deposition for dual-gated graphene devices", Applied Physics Letters 97, 043107 (2010).
Lee et al. "Conformal $Al_2O_3$ dielectric layer deposited by atomic layer deposition for graphene-based nanoelectronics", Appl. Phys. Lett. 92, 203102 (2008); doi: 10.1063/1.2928228.
Pirkle et al. "In situ studies of $Al_2O_3$ and $HfO_2$ dielectrics on graphite", Appl. Phys. Lett. 95, 133106 (2009); doi: 10.1063/1.3238560.
Wang et al. "Atomic Layer Deposition of Metal Oxides on Pristine and Functionalized Graphene", *J. Am. Chem. Soc.*, 2008, 130 (26), pp. 8152-8153.
Zhang et al. "Studies on $H_2O$-based Atomic Layer Deposition of $Al_2O_3$ Dielectric on Pristine Graphene", Journal of Inorganic Material, vol. 27, No. 9, Sep. 12, 2012, pp. 956-960.

\* cited by examiner

GRAPHENE BASED FIELD EFFECT TRANSISTOR

INCORPORATION BY REFERENCE TO RELATED APPLICATION

Any and all priority claims identified in the Application Data Sheet, or any correction thereto, are hereby incorporated by reference under 37 CFR 1.57. This application claims the benefit of European Application No. 13162837.2 filed Apr. 9, 2013. The aforementioned application is incorporated by reference herein in its entirety, and is hereby expressly made a part of this specification.

TECHNICAL FIELD OF THE DISCLOSURE

The present disclosure relates to the field of semiconductor devices and in particular to the field of graphene-based semiconductor devices. The present disclosure also relates to methods for the manufacture of such devices.

BACKGROUND OF THE DISCLOSURE

An important step in the development of top-gated graphene-based field-effect transistors (FETs) is the growth of high dielectric constant (high-k) materials to act as the gate insulator. For optimal performance, these dielectric thin films should be ultrathin, conformal, and pinhole-free with minimal disorder or traps at the dielectric graphene interface. A very suitable method for controlled deposition of ultrathin homogeneous films is Atomic Layer Deposition (ALD). However, ALD of thin films on graphene is not easy because there is no surface functional group or defect on the inert graphene surface, which are needed for chemical surface reactions the conventional ALD processes are based on.

Several surface treatment methods have been pursued so far to improve the uniformity of gate dielectric growth on graphene by atomic layer deposition (ALD), including the deposition and oxidation of metal films (Fallahazad, B.; Kim, S.; Colombo, L.; Tutuc, E., Dielectric thickness dependence of carrier mobility in graphene with $HfO_2$ top dielectric. Appl Phys Lett 2010, 97 (12)), functionalization of graphene via ozone (Lee, B. K.; Park, S. Y.; Kim, H. C.; Cho, K.; Vogel, E. M.; Kim, M. J.; Wallace, R. M.; Kim, J. Y., Conformal $Al_2O_3$ dielectric layer deposited by atomic layer deposition for graphene-based nanoelectronics. Appl Phys Lett 2008, 92 (20)), and the spin-coating of polymer films as seeding layers (Farmer, D. B.; Chiu, H. Y.; Lin, Y. M.; Jenkins, K. A.; Xia, F. N.; Avouris, P., Utilization of a Buffered Dielectric to Achieve High Field-Effect Carrier Mobility in Graphene Transistors. Nano Lett 2009, 9 (12), 4474-4478). Although these methods possess advantages compared to ALD dielectric deposition directly on pristine graphene, important issues remain unresolved. For example, graphene surface pretreatments that involve an oxidizing treatment generally lead to surface damage of the graphene and degradation of its electronic properties. Furthermore, polymer and oxidized metal seeding layers decrease the total capacitance of the gate dielectric layer due to increased gate thickness and a reduced effective k-value.

SUMMARY OF THE DISCLOSURE

A clear need remains the art for a graphene chemical functionalization that: (i) efficiently and uniformly seeds ALD growth; (ii) preserves the underlying graphene structure; and (iii) achieves desirable dielectric properties such as low leakage current and high capacitance. Good graphene-based semiconductor devices comprising an ALD-grown high-k dielectric layer are also desirable. This has been particularly challenging before due to the bad nucleation of ALD layers on the graphene surface.

It is an advantage of various embodiments that a very thin high-k dielectric layer (in the order of a few nm) can be provided to a graphene-based semiconductor device.

It is an advantage of various embodiments that a conformal high-k dielectric layer can be provided to a graphene-based semiconductor device.

It is also an advantage of various embodiments that a pinhole-free or at least a pinhole-poor high-k dielectric layer can be provided to a graphene-based semiconductor device.

It is also an advantage of various embodiments that a high-k dielectric layer with minimal disorder or traps at the high-k-graphene interface can be provided to a graphene-based semiconductor device.

It is yet another advantage of various embodiments that a high-k dielectric layer can be provided in a controlled way to a graphene-based semiconductor device.

It is yet another advantage of various embodiments that a homogeneous high-k dielectric layer can be provided to a graphene-based semiconductor device.

It is yet another advantage of various embodiments that a high-k dielectric layer can be provided to a graphene-based semiconductor device without damaging the surface of the graphene and without degrading its electronic properties.

It is yet another advantage of various embodiments that a high-k dielectric layer can be provided to a graphene-based semiconductor device while keeping the gate thickness at a very low value (e.g. down to 2 nm), thereby allowing scaling of the total capacitance.

It is yet another advantage of various embodiments that a graphene-based semiconductor device can be obtained showing low leakage current.

The method and device according to the various embodiments may offer one or more of the advantages set forth above.

In a first aspect, a semiconductor device is provided comprising: a graphene layer, a graphene oxide layer overlaying the graphene layer, and a high-k dielectric layer overlaying the graphene oxide layer. This is advantageous because the presence of the graphene oxide layer provides oxygen functional groups facilitating the deposition of the high-k dielectric layer. The later can therefore be of high quality (e.g., thin, conformal, pinhole-poor, homogeneous, etc.). Furthermore, the presence of the graphene oxide layer does not deteriorate the electronic properties of the first graphene layer; and the impact of the graphene oxide layer on the equivalent oxide thickness is minimal.

In an embodiment, the high-k dielectric layer may be conformal, i.e., of even thickness.

In an embodiment, the high-k dielectric layer may be pinhole-free.

In an embodiment, the high-k dielectric layer may be obtainable by a method comprising at least one ALD step. This is advantageous because ALD assures very high conformality and excellent thickness control of the high-k dielectric layer.

Typically, the high-k dielectric layer may have a thickness in the range 2-50 nm.

In an embodiment, the high-k dielectric layer may have a thickness of less than 45 nm, preferably less than 30 nm, more preferably less than 20 nm, even more preferably less than 15 nm, yet even more preferably less than 10 nm and most preferably less than 5 nm. This is advantageous because a thin high-k dielectric layer allows higher switching speed in a FET. For instance, the high-k dielectric layer may have a thickness of from 2 to 45 nm, 2 to 10 nm or from 2 to 5 nm or any range in between.

In an embodiment, the device may be a Field Effect Transistor (FET) having a channel and wherein the graphene layer serves as the channel. In an embodiment, the FET may be a tunnel FET (TFET).

In an embodiment, the graphene oxide layer may have an oxygen coverage which is from 5 to 50%, preferably from 10 to 50%, preferably from 12 to 50%, more preferably from 15 to 50%, even more preferably from 20 to 50% and most preferably from 25 to 50%, wherein the oxygen coverage is defined as the number of oxygen atoms of the graphene oxide layer divided by the number of carbon atoms of the graphene oxide layer, multiplied by 100%. An oxygen coverage of 5% is already sufficient for improving and permitting the deposition of a uniform high-K dielectric layer. An oxygen coverage of at least 25% is advantageous because in addition to permitting the deposition of a uniform high-k dielectric layer, it makes the graphene oxide an insulator, thereby keeping the equivalent oxide thickness low.

In an embodiment, the graphene oxide layer may have a resistivity higher than $10^{10}$ Ohm/square.

In an embodiment, the graphene oxide layer may have an optical band gap of from 1 to 3 eV, (typically from 1.5 to 2.5 eV). A relatively large band gap is advantageous because it reduces equivalent oxide thickness. A graphene oxide layer having a band gap of from 0.1 to 1 eV will be good enough to promote the growth of the high-k dielectric layer but will not be ideal for the electrical properties.

In an embodiment, a majority of the oxygen atoms in the graphene oxide layer may be linked to two carbon atoms of the graphene oxide layer, thereby forming an epoxy bond. For instance, more than 50% of the oxygen atoms, preferably more than 60% of the oxygen atoms, yet more preferably more than 70% of the oxygen atoms and most preferably more than 80% of the oxygen atoms may be linked to two carbons of the graphene of the graphene oxide layer. For instance, this percentage can be about 90%.

In a second aspect, a method is provided for manufacturing a semiconductor device, the method comprising the steps of a) providing a graphene oxide layer on top of a graphene layer, and b) exposing the graphene oxide layer to alternating metal precursor (for high-k metal oxide) ALD pulses and oxygen precursor ALD pulses so as to form a high-k metal oxide layer.

In other words, step b) may be exposing the graphene oxide layer to ALD precursors so as to form a high-k metal oxide layer. This method may also comprise before step a), providing a graphene layer on a substrate. An advantage of the presence of the graphene oxide layer is that it permits the growth of a high-k metal oxide layer of good quality via ALD.

Providing a graphene oxide layer on top of a graphene layer has the advantage to preserve the electronic properties of the graphene layer. In the prior art where the oxidizing treatment is performed on the only graphene layer of the device, the electronic properties of the graphene layer are deteriorated.

In a first general embodiment of the second aspect, step a) may comprise: i. providing on a substrate a graphene double layer comprising a first and a second graphene layer, thereby forming a substrate-double graphene layer stack, and ii. exposing the second graphene layer to reactive oxygen species so as to form a graphene oxide layer from the second graphene layer. This method has the advantage, when compared to the second general embodiment below, of avoiding an additional step of transferring the graphene oxide layer on top of the first graphene layer.

The reactive oxygen species may be provided by any known graphene oxidation method such as thermal oxidation or contact with an $O_3$ gas but is preferably provided via a plasma process.

In embodiments, the reactive oxygen species may be a plasma of molecular oxygen and/or ozone. Preferably, the reactive oxygen species is a plasma of molecular oxygen (without ozone). An RF plasma of molecular oxygen is preferred.

In embodiments where the reactive oxygen species are a plasma of molecular oxygen or ozone (preferably molecular oxygen), at least one plasma pulse may be used (e.g. one molecular oxygen plasma pulse). If more than one pulse is used, a better insulator can be produced. Preferably, the molecular oxygen plasma is generated in a RF plasma reactor chamber.

In a second general embodiment of the second aspect, step a) may comprise: i. providing on a substrate a first graphene layer, ii. exposing a second graphene layer to reactive oxygen species, so as to form a graphene oxide layer from the second graphene layer, and iii. providing the graphene oxide layer on top of the first graphene layer.

This second general embodiment is safer for the first graphene layer as it is never potentially exposed to the reactive oxygen species. However, the first general embodiment is sufficiently safe for the first graphene layer (see FIG. 3).

In embodiments of the second aspect, the step of exposing the second graphene layer to reactive oxygen species may comprise exposing the second graphene layer to a plasma (e.g. an $O_2$ and/or $O_3$ plasma), preferably a molecular oxygen ($O_2$) plasma, more preferably a molecular oxygen RF plasma.

Molecular oxygen plasma is preferred because, compared to ozone plasma, it is a faster and safer method creating less defects in the second graphene layer In any embodiment of the second aspect (first general embodiment or second general embodiment), the exposure to the plasma may be indirect. By indirect exposure, it is meant an exposure wherein the second graphene layer is not directly hit by the reactive oxygen species when they are accelerated from a first electrode to a second electrode. An indirect exposure is advantageous as it permits an indirect exposure of the graphene to the reactive oxygen (e.g. plasma), thereby oxidizing it without physical damages (e.g. due to ion impact). Preferably, the holders are such as to have the second graphene layer at less than 2 cm, preferably less than 1.5 cm from the bottom. An indirect exposure may for instance comprise exposing the second graphene layer to a plasma generated in a chamber different from the chamber where the second graphene layer is situated. In a preferred embodiment for the indirect exposure, the indirect exposure may be performed in a (e.g. RF) plasma reactor chamber having a first electrode and a second electrode, wherein the reactive oxygen species are accelerated from the first electrode toward the second electrode, and wherein the second graphene layer is provided on a substrate (e.g. as a part of the substrate-double graphene layer stack) and placed (e.g. held by insulating holders) in between the first electrode and the second electrode in such a way that the second graphene layer is facing the second (e.g. bottom) electrode while the substrate is facing the first electrode. For instance, insulating holders may be placed to stand on the second (e.g. bottom) electrode.

The above-mentioned preferred embodiment for the indirect exposure has the additional advantage to require little equipment and little space since a plasma generation chamber separated from a plasma exposure chamber is not required.

In an embodiment, the oxygen plasma treatment may comprise an exposure to a plasma pulse (9) comprising a ramping up to a power of from 50 to 200 W in a time comprised in a range from 1 and 10 s, optionally followed by an exposure at constant power lasting maximum 5 s.

In an embodiment, the ramping up may be a ramping up from a power of 0 W to a power of from 50 to 200 W.

In an embodiment, the oxygen plasma may be generated with a molecular oxygen pressure at from 10 mTorr to 30 mTorr, preferably 15 mTorr to 25 mTorr.

In an embodiment, the metal precursor for high-k metal oxide may be aluminium or a hafnium containing precursor.

An example of Al precursor is trimethylaluminum but other precursors known to the person skilled in the art may be used as well.

An example of Hf precursors is $HfCl_4$ but other precursors known to the person skilled in the art may be used as well.

An example of oxygen precursor for the ALD may be $H_2O$ but other precursors known to the person skilled in the art may be used as well.

$H_2O$ is advantageous because $H_2O$, unlike other oxygen precursors such as $O_3$, have a lesser tendency to modify the oxidation of the previously formed graphene oxide, thereby preserving its qualities. However, both $H_2O$ and $O_3$ can be used.

In an embodiment, after step a) and before step b), the device may be annealed to a temperature high enough to desorb weakly-bonded oxygen species. This temperature may for instance be 100° C. or more or 130° C. or more. For instance, it can be 150° C. It can for instance be in the range 100° C.-200° C. Such an annealing step may optionally also be performed before exposing the second graphene layer to reactive oxygen species.

In embodiments, the material of the high-k dielectric layer can comprise $Al_2O_3$ and/or $HfO_2$.

In embodiments, the substrate may be a semiconductor substrate such as a Si or a Ge substrate. In embodiments, the semiconductor substrate may have an oxide top layer such as a $SiO_2$ or a $GeO_2$ layer.

In embodiments, the insulating holders may be made of glass.

Particular and preferred aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE DRAWINGS

FIG. 2 (bottom) is a graph of the resistance (R) versus the number of $O_2$ pulses (O2#) for both a device according to the prior art (B) and a device according to the present disclosure (A).

DESCRIPTION OF ILLUSTRATIVE EMBODIMENTS

Figure 1:
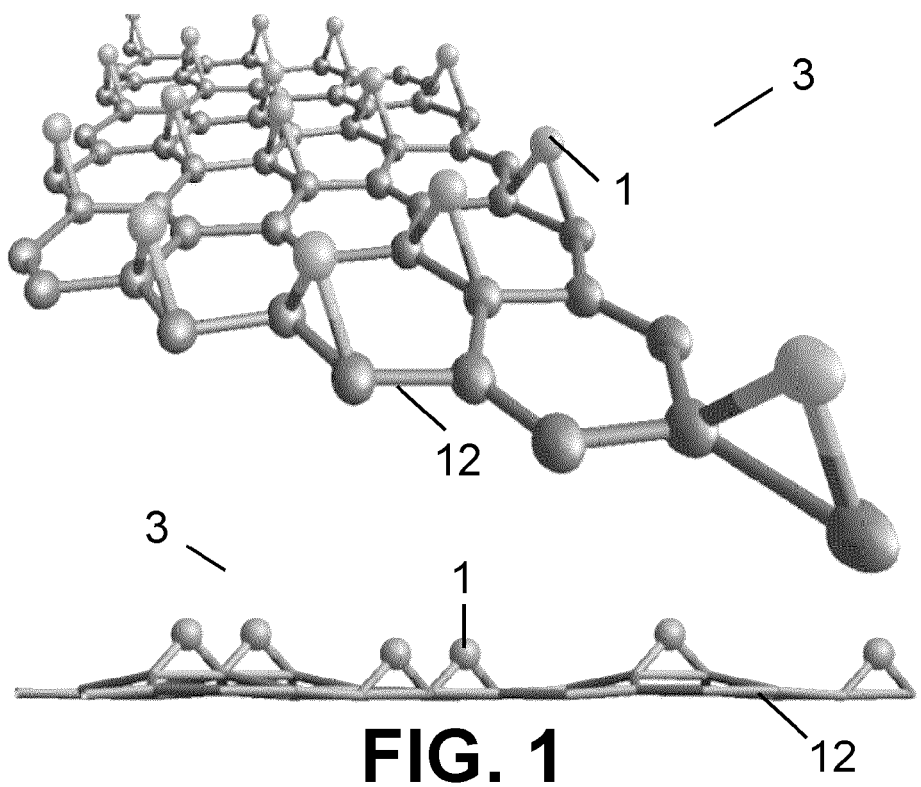
FIG. 1 is a schematic representation of a graphene oxide layer viewed at two different angles.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms "first", "second", "third" and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms "top", "bottom", "over", "under" and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The disclosure will now be described by a detailed description of several embodiments of the disclosure. It is clear that other embodiments of the disclosure can be configured according to the knowledge of persons skilled in the art, the disclosure being limited only by the terms of the appended claims.

Reference will be made to transistors. These are three-terminal devices having a first main electrode such as a drain, a second main electrode such as a source and a control electrode such as a gate for controlling the flow of electrical charges between the first and second main electrodes. As used herein and unless provided otherwise, the term graphene oxide layer refers to a single layer (a monolayer) of graphene oxidized to some degree. Preferred graphene oxide layer used in the present disclosure have an oxygen coverage of from 5 to 50%. Preferably, a majority of the oxygen atoms are linked to two carbons of the graphene of the graphene oxide layer, thereby forming an epoxy bond. An oxygen coverage of 50% corresponds to a saturation value where each carbon atom is linked to one oxygen and each oxygen is linked to two carbon atoms.

FIG. 1 schematically represents a graphene oxide layer (3) and more precisely an epoxidized graphene layer (3) according to two different perspective views. Graphene oxide (or epoxide) (3) is composed of a two-dimensional graphene plane macromolecule (12) having in-plane sigma bonds and having out-of plane oxygen epoxide (C—O—C) (1) functional groups. The oxygen epoxide functional groups (1) are all on the same side of the plane (12) comprising the carbon atoms. In the bottom perspective views, it is clear that the carbon atoms are all in one plane (12) and that the oxygen epoxide groups (1) are sticking out on one side of the plane (12).

Typically, every carbon atom which is bonded to an oxygen atom (1) in the fully oxidized graphene plane (12) is bounded to only one oxygen atom (1), while every oxygen atom (1) bonded to the graphene plane (12) is bonded to two carbon atoms.

Typically, every carbon atom in the graphene plane (12) of fully oxidized graphene oxide (3) share one oxygen atom (1) with a second carbon atom while every oxygen atom (1) bonded to the graphene plane (12) is bonded to two carbon atoms. Hydroxyl groups are present along the edges of the graphene plane (not shown). A graphene oxide as shown in FIG. 1 is a high quality insulator (resistivity above $10^{10}$ Ohm/square) with an optical bandgap of about 2 eV. The thickness of the graphene oxide is about 3 angstrom.

EXAMPLE 1

Device Fabrication

Figure 2:
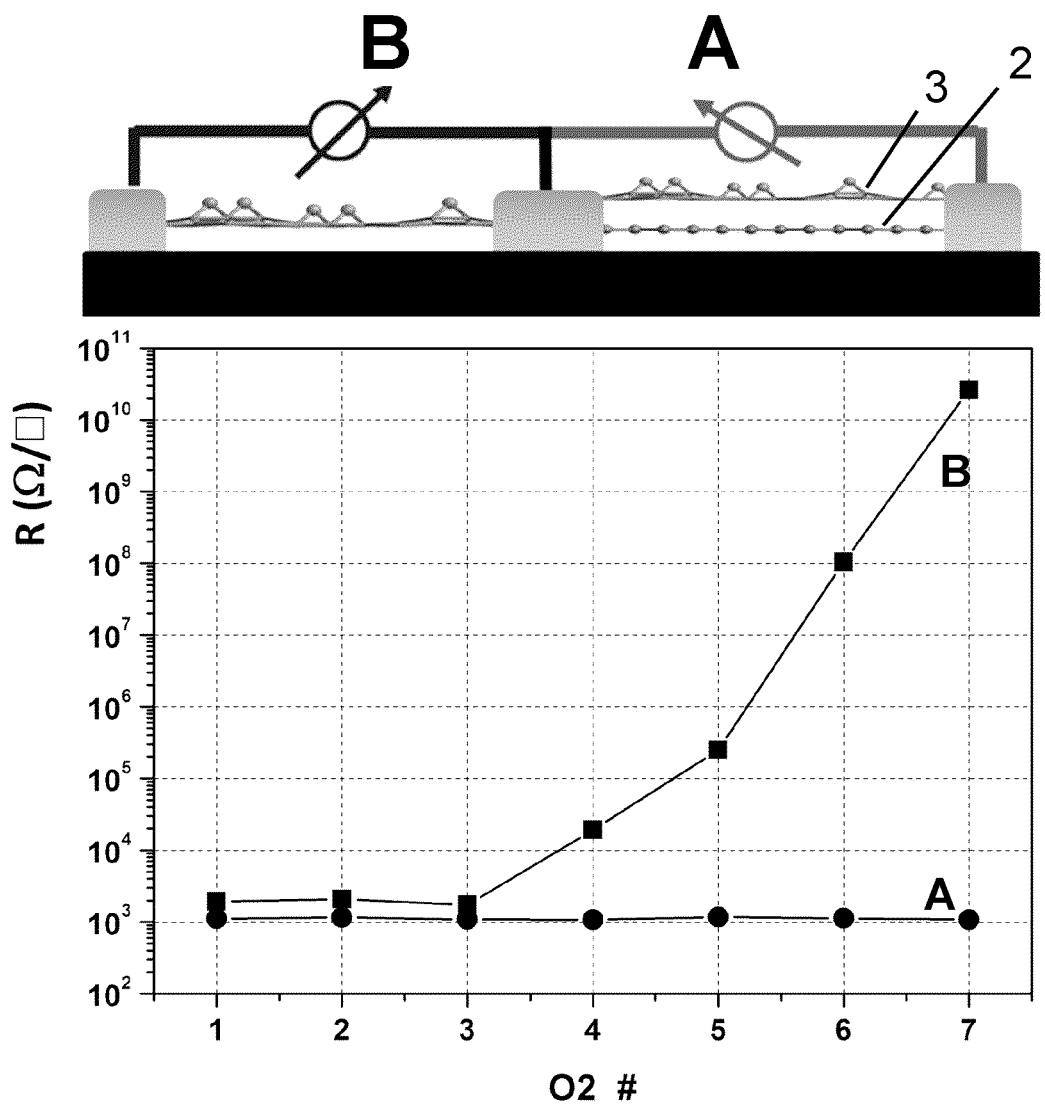
FIG. 2 (top) schematically represents a device (B) according to the prior art and a device (A) according to the present disclosure.

Reference is now made to FIG. 2.

Both samples A and B were formed on the same substrate (4).

Preparation of sample B:

A single layer graphene (SLG) flake (2) was deposited by micromechanical exfoliation on an n-doped Si substrate (4) covered with a 90 nm thermally grown $SiO_2$ film, thereby forming sample B.

Preparation of sample A:

A single layer graphene (SLG) flake (2) was deposited by micromechanical exfoliation on an n-doped Si substrate (4) covered with a 90 nm thermally grown $SiO_2$ film.

A large graphene film was then grown on copper thin film via Chemical Vapor Deposition (CVD). This film was then isolated from the copper foil and transferred onto the $SiO_2$-supported graphene flake (2) by the standard polymethylmethacrylate (PMMA) transferring method, thereby forming a substrate-double-layer graphene stack (sample A).

Standard photolithography was then performed on both sample A and sample B to (i) pattern samples A and B in narrow ribbons and (ii) fabricate multi-terminal FET devices, employing 50 nm Au lift-off metallization.

Figure 6:
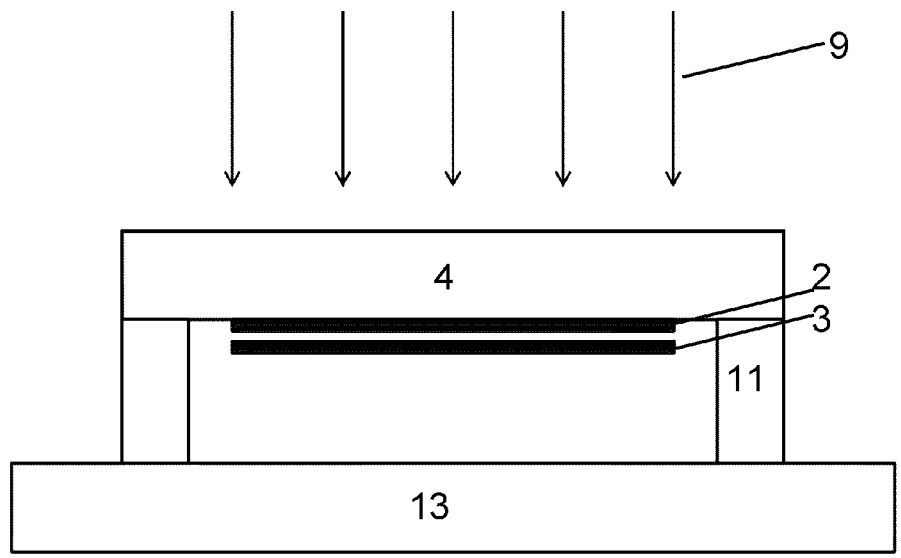
FIG. 6 is a schematic representation of a method for manufacturing a semiconductor device according to an embodiment of the present disclosure.

Sample A and B where then provided in the chamber of an RF-plasma system fed with molecular oxygen gas. The used RF-plasma system was a parallel plate system operating at 13.57 MHz. There, the samples were annealed at 150° C. to desorb weakly-bonded oxygen species. Then, the samples were exposed one or more times to an atomic oxygen plasma formed by decomposition of $O_2$. Each exposure step was performed by linearly increasing the power from 0 to 100 W in 3.3 s and then keeping the power at 100 W for 1.0 s. The oxygen pressure in the chamber was 20 mTorr. After each exposure step, the samples were annealed at 150° C. to desorb weakly-bonded oxygen species. In order to minimize the physical impact of the plasma due to the direct collision of charged particles to the graphene surface, samples (substrate 4 and graphene monolayer 2 or substrate 4 and graphene 2-graphene oxide 3 bilayer) were placed upside down, held on a pair of 1.0 cm tall glass holders 11, facing the bottom 13 of the reactor chamber. This is represented in FIG. 6 for sample A where the plasma is represented by the arrows 9.

EXAMPLE 2

Electrical Characterization

The resistances of samples A and B were measured after each plasma exposure/annealing step.

FIG. 2 compares the resistance of A and B versus the number of plasma exposure pulses.

The resistance of sample A was relatively constant while the resistance of sample B exponentially increased to $10^{11} \Omega$.

Sample B (CVD graphene) changed to high resistance (insulator) upon oxidation.

The almost-constant resistance observed for sample A (stack of exfoliated single layer graphene (SLG) & CVD graphene) indicates that the underlying (metallic) SLG remains intact once the top layer (CVD graphene) undergoes oxidation.

Figure 3:
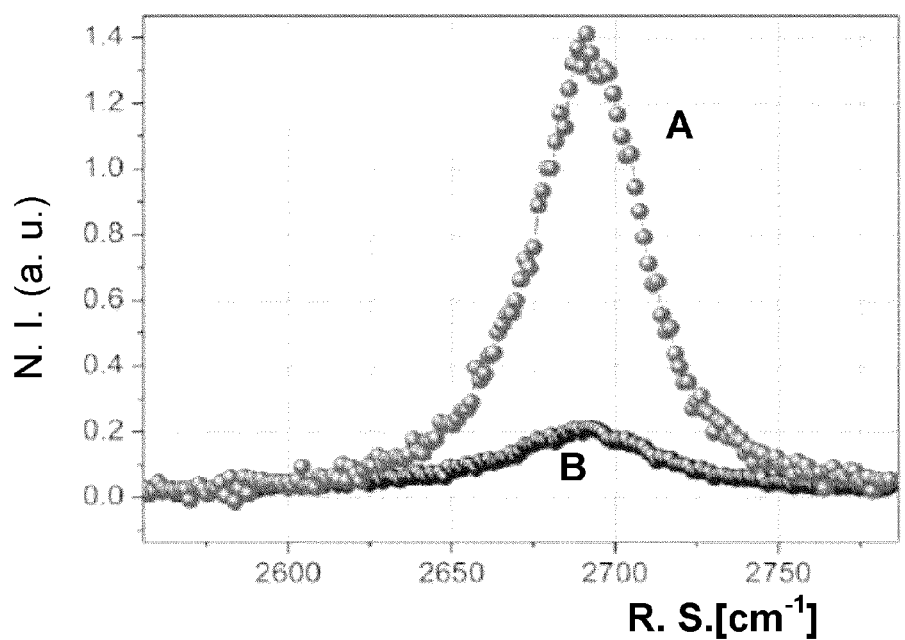
FIG. 3 is a graph of the normalized intensity versus the Raman shift (Raman 2D mode) for A (a device according to the present disclosure) and B (a device according to the prior art).

We now refer to FIG. 3.

The most discussed feature in Raman spectra of graphene is the so-called 2D peak around 2700 $cm^{-1}$, which is attributed to a two-phonon intervalley Raman scattering process. In the case of single layer graphene, the 2D peak consists of a single peak due to the presence of a single valence and conductance energy band for the excitation with visible light, making only a single two-phonon scattering process possible at K symmetry point of the Brillouin zone. FIG. 3 compares the normalized 2D peaks ($I_{2D}/I_G$) of samples A & B after exposure to the oxygen plasma. Due to the oxidation treatment, the 2D peak of sample B broadens (110 $cm^{-1}$) and its intensity decreases significantly (~0.2) but the shape, position (~2675 $cm^{-1}$), FWHM (~36 $cm^{-1}$) and intensity (~1.4) of 2D peak of sample A indicates that the underlying graphene layer remains intact once the top layer (CVD graphene) undergoes oxidation.

EXAMPLE 3

Top Date Stack Fabrication

Figure 4:
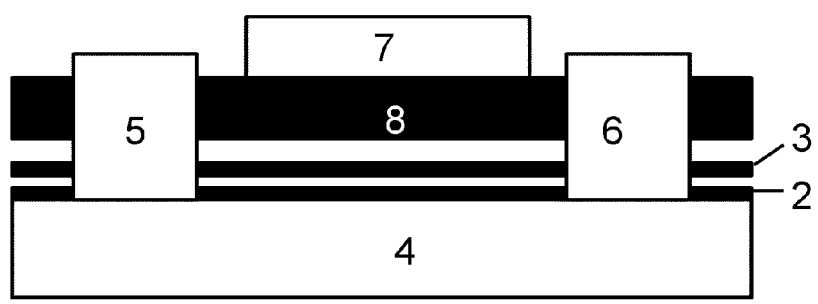
FIG. 4 is a schematic representation of a device according to an embodiment of the present disclosure.

A 30 nm $Al_2O_3$ layer was deposited by ALD on the oxygen rich surface of sample 1 at 150° C. using alternate pulses of trimethylaluminum (TMA) and water. The dual-gate FET fabrication was then completed by fabricating a top-gate electrode by e-beam lithography (1 nm/50 nm Cr/pd). FIG. 4 shows a schematic representation of a dual-gated FET with a graphene 2-graphene oxide 3 stack, wherein the graphene 2 is the channel and ALD-$Al_2O_3$ is grown on the graphene oxide 3.

Figure 5:
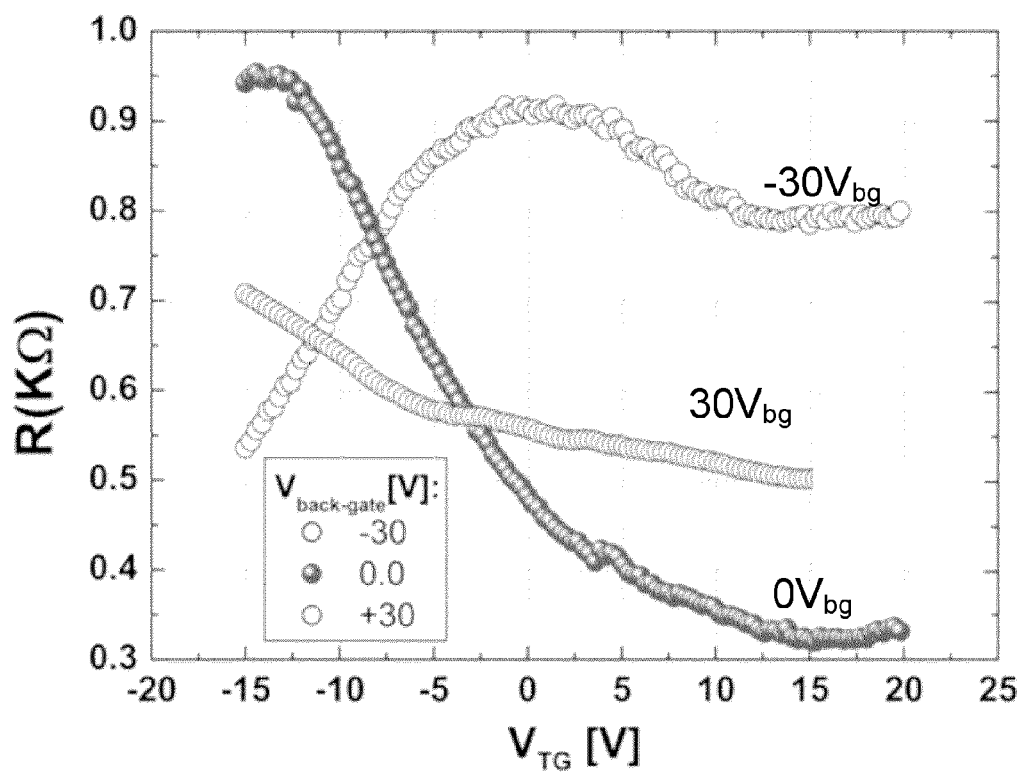
FIG. 5 is a graph of the resistance versus the top-gate voltage for a device according to an embodiment of the present disclosure.

FIG. 5 shows the transfer characteristics (Resistance R vs top-gate voltage ($V_{TG}$)) of the dual-gated FET of example 3 at different voltages. It demonstrates that the source-drain resistance can be modulated with the device obtained in example 3.

FIG. 4 shows a Field effect transistor according to embodiments of the present disclosure. It comprises a semiconductor substrate 4 bearing a graphene layer 2 and a graphene oxide layer 3. It further comprises a high-k dielectric layer 8 on top of the graphene oxide layer 3. A source 5 and a drain 6 are also present defining a channel 2 between them. A top electrode 7 is present above the high-k dielectric layer 8.

Figure 7:
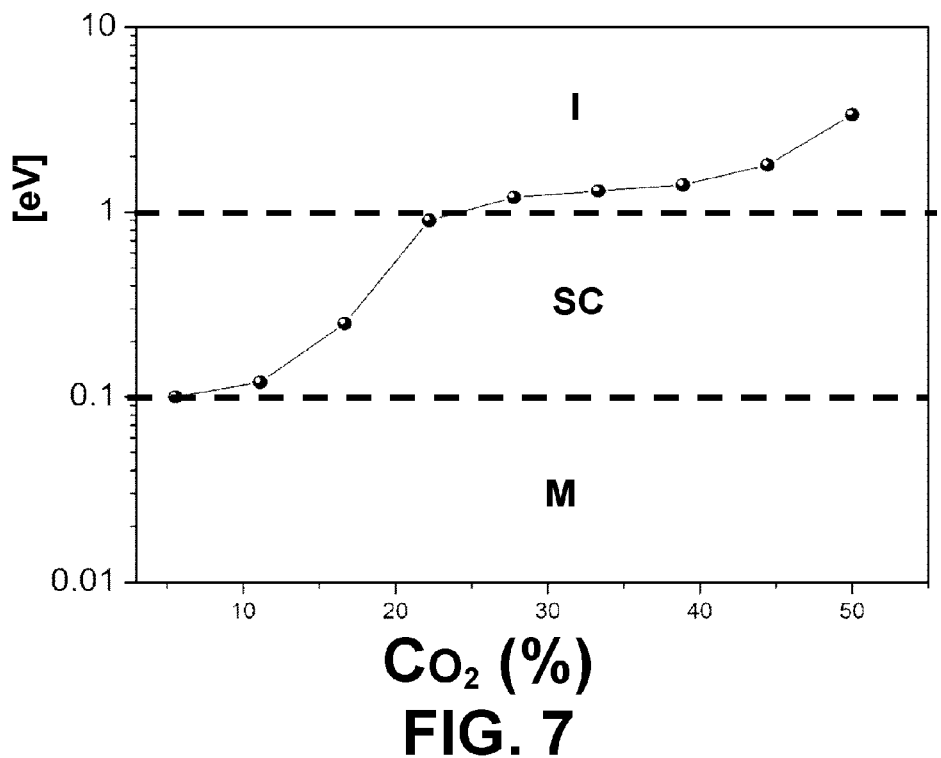
FIG. 7 is a graph of the band gap of graphene oxide [eV] as a function of the oxygen coverage ($Co_2$, %).

FIG. 7 shows a graph of the band gap of graphene oxide [eV] as a function of the oxygen coverage (%). Three energy zones are defined: For a band gap below 0.1, the graphene oxide is a metal (M). This corresponds to an oxygen coverage of up to about 10%. For a band gap between 0.1 and 1, the graphene oxide is a semiconductor (SC). This corresponds to an oxygen coverage of from 10 to 20%. For a band gap of from 1 to about 3 eV, the graphene oxide is an insulator (I). This corresponds to an oxygen coverage of from 20 to 50%. The oxygen coverage is here defined as the number of oxygen atoms in the graphene oxide layer divided by the number of carbon atoms in the graphene oxide layer, multiplied by 100%. An oxygen coverage of 50% corresponds to a graphene oxide layer composed of a graphene layer saturated by oxygen epoxide groups.

It is to be understood that although preferred embodiments, specific constructions and configurations, as well as materials, have been discussed herein for devices according to the present disclosure, various changes or modifications in form and detail may be made without departing from the disclosure. For example, any formulas given above are merely representative of procedures that may be used. Functionality may be added or deleted from the block diagrams and operations may be interchanged among functional blocks. Steps may be added or deleted to methods described within the scope of the present disclosure.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A field effect transistor device comprising:
   a semiconductor substrate;
   a source;
   a drain;
   a graphene layer channel, wherein the source and the drain define the graphene layer channel therebetween;
   a graphene oxide layer overlaying the graphene layer channel, wherein the graphene oxide layer has an oxygen coverage of from 25 to 50%, wherein the oxygen coverage is a number of oxygen atoms of the graphene oxide layer divided by a number of carbon atoms of the graphene oxide layer, multiplied by 100%, wherein the graphene oxide layer has a resistivity higher than $10^{10}\Omega$/square, wherein the graphene oxide layer has an optical band gap of from 1 to 3 eV, and wherein the graphene oxide is an insulator;
   a high-k dielectric layer overlaying the graphene oxide layer; and
   a top electrode situated atop the high-k dielectric layer.

2. The semiconductor device of claim 1, wherein the high-k dielectric layer is obtainable by a method comprising at least one atomic layer deposition step.

3. The device of claim 1, wherein the high-k dielectric layer has a thickness of from 2 nm to 45 nm.

4. The device of claim 1, wherein the high-k dielectric layer has a thickness of from 2 nm to 5 nm.

5. The device of claim 1, wherein the graphene oxide layer comprises oxygen atoms and carbon atoms and wherein a majority of the oxygen atoms are linked to two carbons of the graphene oxide layer, thereby forming an epoxy bond.

6. The device of claim 1, wherein the field effect transistor is a dual-gate field effect transistor.

7. The device of claim 1, wherein the high k-dielectric layer is an $Al_2O_3$ layer.

8. The device of claim 1, wherein the graphene oxide layer has an optical band gap of from 1.5 to 2.5 eV.

9. The device of claim 1, wherein the graphene layer gate is a graphene monolayer.

* * * * *